(12) United States Patent
Wang et al.

(10) Patent No.: US 11,841,381 B2
(45) Date of Patent: Dec. 12, 2023

(54) WAFER INSPECTION METHOD AND INSPECTION APPARATUS

(71) Applicant: CHROMA ATE INC., Taoyuan (TW)

(72) Inventors: Tsun-I Wang, Taoyuan (TW); I-Shih Tseng, Taoyuan (TW); Min-Hung Chang, Taoyuan (TW); Tzu-Tu Chao, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/950,467

(22) Filed: Sep. 22, 2022

(65) Prior Publication Data

US 2023/0105061 A1    Apr. 6, 2023

Related U.S. Application Data

(60) Provisional application No. 63/251,245, filed on Oct. 1, 2021.

(51) Int. Cl.
| | |
|---|---|
| *G01R 31/20* | (2006.01) |
| *G01R 1/073* | (2006.01) |
| *G01R 1/067* | (2006.01) |
| *G01R 1/28* | (2006.01) |
| *G01R 31/3185* | (2006.01) |

(52) U.S. Cl.
CPC ..... *G01R 1/07385* (2013.01); *G01R 1/06766* (2013.01); *G01R 1/28* (2013.01); *G01R 31/318511* (2013.01)

(58) Field of Classification Search
CPC ............ G01R 31/2831; G01R 31/2886; G01R 31/2863; G01R 31/2868; G01R 31/2889; G01R 31/318511; G01R 1/06766; G01R 1/06794; G01R 1/07385; G01R 1/28
See application file for complete search history.

(56) References Cited

U.S. PATENT DOCUMENTS

| | | | |
|---|---|---|---|
| 6,246,250 B1 * | 6/2001 | Doherty | G01R 1/07385 324/754.07 |
| 2009/0127553 A1 * | 5/2009 | Marie | H01L 22/34 257/E23.179 |
| 2010/0013503 A1 * | 1/2010 | Huebner | G01R 31/31926 324/757.03 |
| 2010/0213960 A1 * | 8/2010 | Mok | G01R 35/00 324/762.03 |
| 2010/0237891 A1 * | 9/2010 | Lin | G01R 31/2851 324/750.3 |

(Continued)

*Primary Examiner* — Thang X Le
(74) *Attorney, Agent, or Firm* — WPAT, P.C.

(57) ABSTRACT

A wafer inspection method and inspection apparatus are provided. On a wafer having layout lines connecting electrode points of individual dies in series, the dies within a matrix range are inspected one after another in turn in a column/row control means by a first switch group and a second switch group of a probe card, so that each die is selectively configured in a test loop of a test process by turning on/off of a corresponding switch. Thus, after inspection of a die under inspection (a selected die) within the matrix range is complete, the column/row control means is used to switch to a next die to achieve fast switching. Accordingly, for the inspection procedure of each die within the matrix region, a conventional procedure of moving one after another in turn can be eliminated, significantly reducing the total test time needed and enhancing inspection efficiency.

19 Claims, 8 Drawing Sheets

(56) References Cited

U.S. PATENT DOCUMENTS

| | | | |
|---|---|---|---|
| 2011/0043233 A1* | 2/2011 | Arkin | G01R 31/2889 324/755.03 |
| 2013/0082731 A1* | 4/2013 | Lou | G01R 31/2844 324/762.01 |

* cited by examiner

WAFER INSPECTION METHOD AND INSPECTION APPARATUS

CROSS REFERENCE TO RELATED APPLICATION

The present application claims priority to U.S. Provisional Patent Application No. 63/251,245 filed on Oct. 1, 2021, the entire content of which is incorporated by reference to this application.

BACKGROUND OF THE INVENTION

Field of the Invention

The present invention relates to wafer inspections and, more particularly, to a wafer inspection method and inspection apparatus.

Description of the Prior Art

In wafer inspection, contacts are formed by probes and electrode points of dies, so as to perform electrical testing. Conventionally, a series of procedures of moving a wafer need to be performed for individual dies on the wafer, so as to allow the probe to test the individual dies one after another in turn until testing of all of the dies is complete.

Thus, for a piece of wafer having millions of dies as objects under inspection, the inspection approach above results in immense test costs.

On the other hand, in addition to electrical testing of dies, dies having a light emitting characteristic require light intensity testing to determine whether the light emitting ability of the dies meets expected standards. Conventionally, an integrating sphere is needed to measure each die on the wafer. For each die, the integrating sphere needs to collect light entering the sphere, reflection is formed inside a shell of the sphere to achieve a uniform light effect, and luminosity is measured by a photo detector of the integrating sphere, for example, measuring light flux.

However, in the above testing means, in addition to leading to noticeably increased time overhead of inspection by such sequential testing of each die, the integrating sphere needs to be extremely close to light emitting surfaces of the dies in order to increase the light yield, hence further elevating complications in both aspects of control and time arrangements.

SUMMARY OF THE INVENTION

According to some implementations, a wafer inspection apparatus is for inspecting a plurality of dies within a matrix region on a wafer. The wafer is laid out with a plurality of first layout lines, a plurality of second layout lines, a plurality of first contact pads correspondingly coupled to the plurality of first layout lines, respectively, and a plurality of second contact pads correspondingly coupled to the plurality of second layout lines, respectively. Each of the first layout lines couples to a first electrode point of each of the dies arranged in a same column, and each of the second layout lines couples to a second electrode point of each of the dies arranged in a same row. The wafer inspection apparatus includes: a probe card, for providing a selected one of the dies a first route and a second route, the first route, the second route and the selected die forming a test loop in an inspection procedure, the probe card including a plurality of first probes, a plurality of second probes, a first switch group coupled to the first probes, and a second switch group coupled to the second probes. Each of the first probes is provided for contacting corresponding one of the first contact pads in the inspection procedure, and each of the second probes is provided for contacting corresponding one of the second contact pads in the inspection procedure. The first switch group is controlled to couple one of the first probes to the first route, and the second switch group is controlled to couple one of the second probes to the second route, wherein the first switch group and the second switch group enable the selected die to be configured in the test loop.

According to some implementations, the first switch group includes a plurality of first switches correspondingly coupled to the first probes, respectively, and the second switch group includes a plurality of second switches correspondingly coupled to the second probes, respectively. One end of each of the first switches is coupled to the first route, and the other end of each of the first switches is selectively coupled to the corresponding first probe based on whether the first switch is controlled as turned on or turned off. One end of each of the second switches is coupled to the second route, and the other end of each of the second switches is selectively coupled to the corresponding second probe based on whether the second switch is controlled as turned on or turned off.

According to some implementations, the number of the first probes is equal to the number of the first layout lines, and the number of the second probes is equal to the number of the second layout lines.

According to some implementations, a wafer inspection apparatus is for inspecting a plurality of dies within a matrix region on a wafer. The wafer is laid out with a plurality of first layout lines and a plurality of first contact pads correspondingly coupled to the first layout lines, respectively. Each of the first layout lines couples to a first electrode point of each of the dies arranged under a first classification definition that is one of an arrangement in a same column or an arrangement in a same row. The wafer inspection apparatus includes: a probe card, for providing a selected one of the dies a first route and a second route, the first route, the second route and the selected die forming a test loop in an inspection procedure, the probe card including a plurality of first probes, a plurality of second probes, a first switch group coupled to the first probes, a second switch group, and a plurality of second layout lines coupled to the second switch group, each of the second layout lines correspondingly coupling to each of the second probes arranged under a second classification definition that is the other of the arrangement in a same column or the arrangement in a same row. Each of the first probes is provided for contacting corresponding one of the first contact pads in the inspection procedure, and each of the second probes is provided for contacting a second electrode point of corresponding one of the dies in the inspection procedure. The first switch group is controlled to couple one of the first probes to the first route, and the second switch group is controlled to couple one of the second layout lines to the second route, wherein the first switch group and the second switch group enable the die configured within the test loop to be selected.

According to some implementations, the first switch group includes a plurality of first switches correspondingly coupled to the first probes, respectively, and the second switch group includes a plurality of second switches correspondingly coupled to the second layout lines, respectively. One end of each of the first switches is coupled to the first route, and the other end of each of the first switches is selectively coupled to the corresponding first probe based on whether the first switch is controlled as turned on or turned off. One end of each of the second switches is coupled to the second route, and the other end of each of the second switches is selectively coupled to the corresponding second layout line based on whether the second switch is controlled as turned on or turned off.

According to some implementations, the number of the first probes is equal to the number of the first layout lines, and the number of the second probes is equal to the number of the dies within the matrix region.

According to some implementations, each of the first switches and the second switches is a relay.

According to some implementations, the first contact pads and the second contact pads are disposed on edges of the matrix region, and the matrix region is configured to cover all of the dies on the wafer or to cover part of the dies on the wafer.

According to some implementations, the exposure time is equal to a time needed for the dies within the matrix region to be configured one after another in turn in the test loop during the inspection procedure.

According to some implementations, a camera device for capturing an image of the matrix region is further included. The camera device provides an exposure time to capture an image of a light-emitting state exhibited by the dies within the matrix region configured one after another in turn in the test loop during the inspection procedure.

According to some implementations, a wafer inspection method is for configuring a plurality of dies within a matrix region on a wafer one after another in turn in a test loop needed for inspection. The wafer includes a plurality of first layout lines and a plurality of first contact pads correspondingly coupled to the first layout lines, respectively. Under a first classification definition, a first electrode point of each of the dies is coupled to corresponding one of the first layout lines; under a second classification definition, the dies are presented as a plurality of series arranged in parallel. The wafer inspection method includes a preparation step, an initial route establishing step, an initial route switching step, a first switch group scanning step, and a second switch group scanning step. In the preparation step, a probe card is provided. The probe card includes a plurality of first probes, a plurality of second probes, a first switch group coupled between the first probes and a first route, and a second switch group coupled between the second probes and a second route. In the initial route establishing step, each of the first probes is enabled to contact corresponding one of the first contact pads, and each of the second probes is enabled to couple to a second electrode point of each of the dies. In the initial route switching step, one of the first layout lines is selectively coupled to the first route by controlling the first switch group, one of the plurality of series of dies is selectively coupled to the second route by controlling the second switch group, and the die coupled to both of the first route and the second route is configured to be configured in the test loop. The first classification definition is one of an arrangement in the same column or arrangement in the same row, and the second classification definition is the other of the arrangement in a same column or the arrangement in a same row. In the first switch group scanning step, the first layout lines are switched one after another in turn to couple to the first route by controlling the first switch group, for the corresponding dies to be configured one after another in turn in the test loop for performing inspection, and a next step is performed once all of the first layout lines have been coupled to the first route. In the second switch group scanning step, the dies corresponding to a next one of the series are switched to couple to the second route by controlling the second switch group, and the first switch group scanning step is repeated, until the inspection of the dies within the matrix region is complete once all of the dies corresponding to each series have been coupled to the second route.

According to some implementations, the second switch group scanning step further includes a matrix region switching step in which the matrix region is moved to other regions not yet inspected on the wafer, and the initial route establishing step, the initial route switching step, the first switch group switching step and the second switch group switching step are sequentially repeated, for the dies within the uninspected matrix region to be configured one after another in turn in the test loop needed for inspection, until all the dies on the wafer are completely inspected.

According to some implementations, in the inspection procedure of one matrix region, within a period from a start of the first switch group scanning step to an end of the second switch group scanning step, long-term imaging of the matrix region is performed simultaneously to acquire image data recorded with light emitting levels of the individual dies within the matrix region.

Accordingly, in some embodiments, with a column/row control means of the present invention, fast switching can be performed within this matrix on the wafer including layout lines connecting electrode points in series to input a current to the die to be tested, further completing electrical testing of the die, and the column/row control means is then performed to switch to the next die. Thus, for the inspection procedure of each die within the matrix region of the matrix, a conventional procedure of moving one after another in turn can be eliminated, significantly reducing the total test time needed.

Accordingly, in some embodiments, a long-term exposure approach is used in coordination with a camera device in the column/row control means in a matrix pattern of the present invention to obtain individual testing results of light emitting levels of all the dies within a matrix. A camera device having a broader field of view (FOV) is capable of one-time capturing images of the individual dies within the matrix. Because the column/row control of each round can correspond to one coordinate position in the image captured by the capturing device, the camera device is provided with an identification ability in the aspect of spatial relation based on the coordinate position. Thus, the use of an integrating sphere can be eliminated, further reducing the total test time needed.

DETAILED DESCRIPTION OF THE EMBODIMENTS

Figure 1:
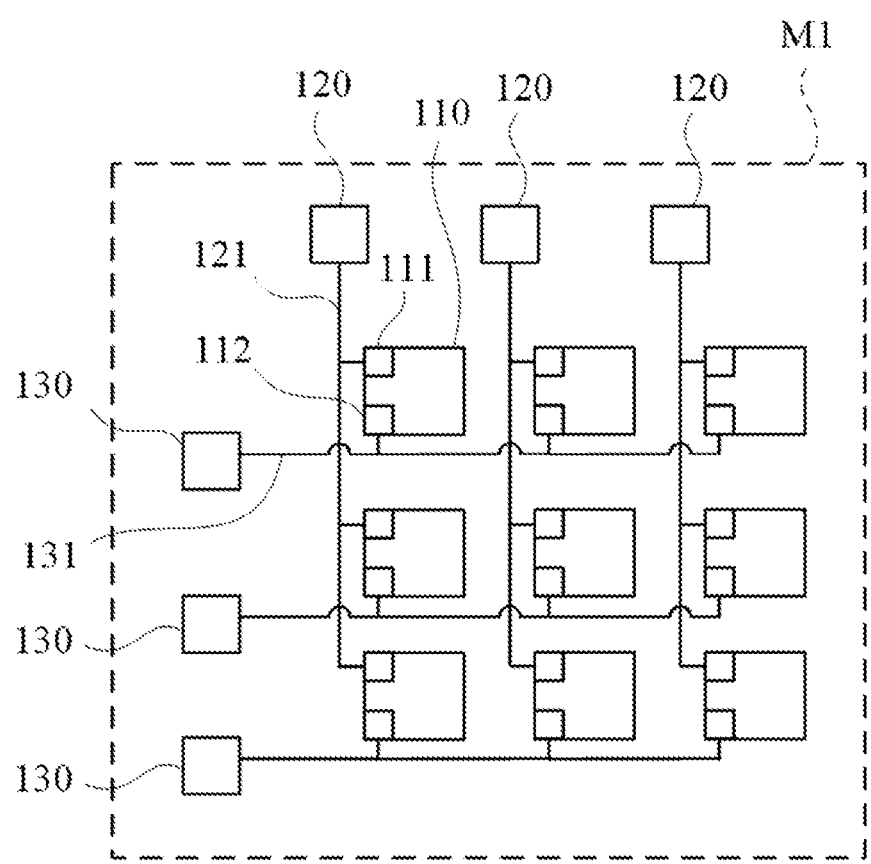
FIG. 1 is a circuit schematic diagram within a matrix region on a wafer according to an embodiment.

Objectives, features, and advantages of the present disclosure are hereunder illustrated with specific embodiments, depicted with drawings, and described below.

In the disclosure, descriptive terms such as "a" or "one" are used to describe the unit, component, structure, device, module, system, portion, section or region, and are for illustration purposes and providing generic meaning to the scope of the present invention. Therefore, unless otherwise explicitly specified, such description should be understood as including one or at least one, and a singular number also includes a plural number.

In the disclosure, descriptive terms such as "include, comprise, have" or other similar terms are not for merely limiting the essential elements listed in the disclosure, but can include other elements that are not explicitly listed and are however usually inherent in the units, components, structures, devices, modules, systems, portions, sections or regions.

In the disclosure, the terms similar to ordinals such as "first" or "second" described are for distinguishing or referring to associated identical or similar components or structures, and do not necessarily imply the orders of these components, structures, portions, sections or regions in a spatial aspect. It should be understood that, in some situations or configurations, the ordinal terms could be interchangeably used without affecting the implementation of the present invention.

It should be understood that, in certain conditions or arrangements, the ordinal terms can be used in exchange without affecting the implementation of the present invention. The term "coupled" used herein refers to a direct electrical connection or an indirect electrical connection.

For example, in the manufacturing field of light-emitting diodes (LEDs), one piece of wafer may contain millions of LED dies in the manufacturing of dies for mini LED sizes or dies for micro LED sizes. With the inspection method and the inspection apparatus disclosed by the embodiments of the present invention, the problem of overly high inspection costs of wafers can be solved.

Each of LED dies has a P-electrode and an N-electrode for receiving a current. With part of transmission lines simultaneously laid out during the wafer manufacturing process, the P-electrodes or N-electrodes of individual dies in the same column or the same row can be connected in series. Alternatively, matrix regions are formed by a matrix configuration, each wafer is divided into a plurality of matrix regions, a transmission line is arranged in each matrix region to connect in series the P-electrode or N-electrode of each of the dies arranged in the same column or the same row, and a contact pad is arranged on one end of the transmission line. Such configuration is equivalent to transferring control points (current input points) of the P-electrode or N-electrode of each of the dies to edges of the matrix region or edges of the wafer, hence achieving control of an entirety of one column or one row for these LED dies.

The definition of one of an arrangement in the same column or an arrangement in the same row may be referred to as a first classification definition; correspondingly, the definition of the other of an arrangement in the same column or an arrangement in the same row may be referred to as a second classification definition. For example, when the first classification definition is defined as an arrangement in the same column, the second classification definition is an arrangement in the same row. Conversely, when the first classification definition is defined as an arrangement in the same row, the second classification definition is an arrangement in the same column.

On the other hand, transferring the contact pads to edges of a matrix region, or configuring the area of the contact pads on edges of a wafer to be slightly larger than the area of the P-electrode pad or the N-electrode pad of each of the dies, can be conducive to reducing difficulties in alignment and contact of probes of a probe card.

Refer to FIG. 1 showing a circuit schematic diagram within a matrix region on a wafer according to an embodiment. As shown in FIG. 1, an example of a circuit layout within a range of a 3*3 matrix M1 on a wafer is given. In the example in FIG. 1, there are a total of nine dies 110 arranged in three columns and three rows within the range of the matrix M1. With the configuration of layout lines serving as transmission lines, within the range of the matrix M1, first electrode points 111 of the dies 110 arranged in the same column are all connected to a corresponding first layout line 121, and second electrode points 112 of the dies 110 arranged in the same row are all connected to a corresponding second layout line 131. Each first electrode point 111 is, for example, one of the P-electrode and N-electrode, and each second electrode point 112 is, for example, the other of the P-electrode and N-electrode. Moreover, each of the first layout lines 121 is connected to a corresponding first contact pad 120, and each of the second layout lines 131 is connected to a corresponding second contact pad 130. Thus, each die 110 within the range of the matrix M1 may be controlled in a matrix manner through the corresponding first contact pad 120 and the corresponding second contact pad 130, further allowing a current to be easily input to the selected die 110 within the range of the matrix M1. After testing, the wafer undergoes a cutting process to separate the dies from one another. The dies after the cutting is, for example, one single die 110 among the nine dies 110 in FIG. 1. That is, the layout lines (the first layout line 121 and the second layout line 131) originally laid out on the wafer may also be separated from the die 110 after the cutting process.

Figure 2:
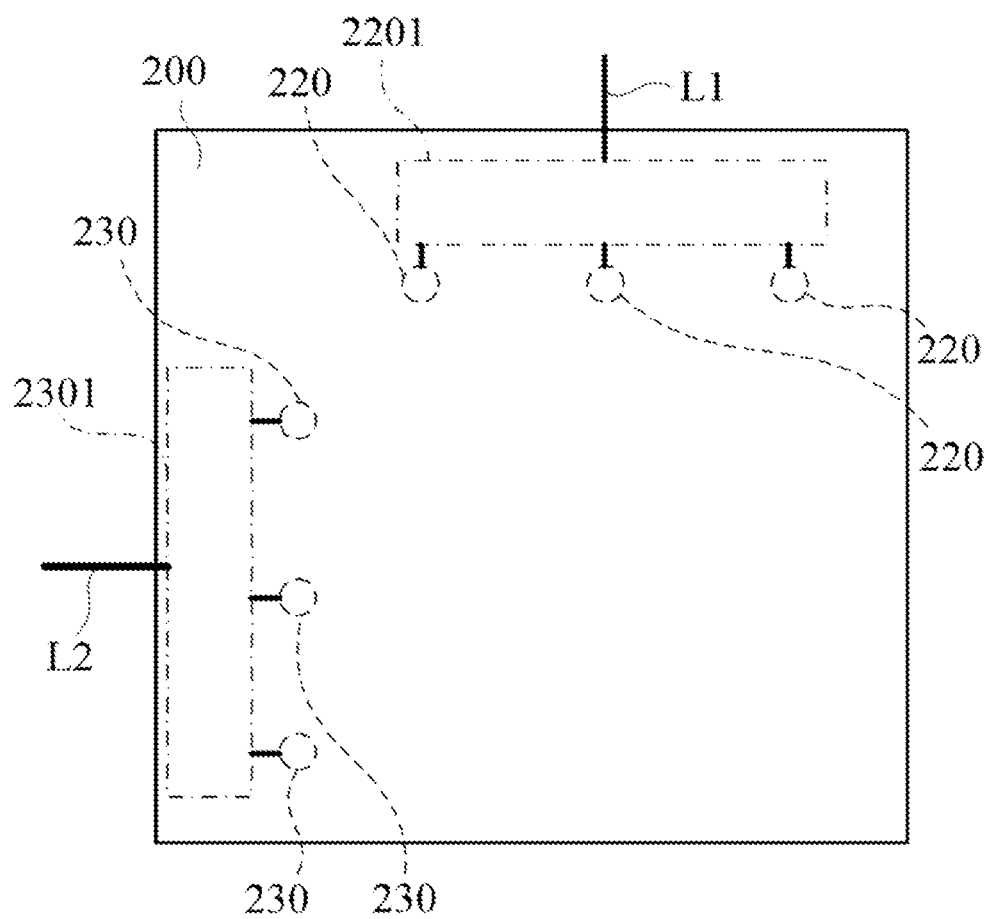
FIG. 2 is a schematic diagram of a probe card corresponding to the exemplary matrix region in FIG. 1 according to an embodiment.

Referring to both of FIG. 1 and FIG. 2, FIG. 2 shows a schematic diagram of a probe card corresponding to the exemplary matrix region in FIG. 1 according to an embodiment. FIG. 2 shows a top schematic diagram in which first probes 220 are depicted as probes extending downward (toward an inspection target). The probe card 200 in FIG. 2 is configured with a plurality of first probes 220 corresponding to the first contact pads 120 of the matrix M1 in FIG. 1, and a plurality of second probes 230 corresponding to the second contact pads 130. The probes are for contacting with the corresponding contact pads during the inspection so as to form a coupling relation. The probe card includes a first switch group 2201 correspondingly coupled to the first probes 220, and a second switch group 2301 correspondingly coupled to the second probes 230. For example, each of the first probes 220 may be coupled to a corresponding switch (for example, a relay) in the first switch group 2201, and each of the second probes 230 may be coupled to a corresponding switch (for example, a relay) in the second switch group 2301. The switches are for coupling to an external current supply loop, and the column and the row to which a current is to flow are selected by controlling each of the switches, further completing power supply to the corresponding die 110 located at an intersection of the selected column and the selected row.

Thus, by controlling the switches and with an externally connected test apparatus such as a source measurement unit (SMU), a connection of an electrical loop with the selected die 110 can be formed to further acquire electrical characteristics of the die 110 and to complete testing of the die 110. In the step of switching to a next die 110 within the matrix as a test target, the selected column and the selected row can be defined simply by controlling the switches, and the die 110 under inspection can also be correspondingly defined, so as to achieve the establishment of a test loop (or referred to as an electrical loop) of the die 110 under inspection. For example, a connection route between the externally connected test apparatus and the probe card 200 may be defined as a first route L1 and a second route L2. The probe card 200 is for providing the first route L1 and the second route L2 to the selected die 110, wherein the first route L1, the second route L2 and the selected die form a test loop in the inspection procedure. A short-circuit (off) state of each switch enables the corresponding die to be coupled to the corresponding route (the first route L1 or the second route L2), and an open-circuit (on) state of each switch enables the corresponding die to be disconnected from the corresponding route (the first route L1 or the second route L2).

In the embodiment above, each matrix region on the wafer is provided with the respective first contact pads 120 and second contact pads 130, and the wafer is moved to allow different matrix regions to contact one after another in turn with the probe card, thus completing testing of all the dies on the wafer. In other embodiments, the first contact pads 120 and the second contact pads 130 may also be disposed on edges of the wafer, so as to form one single wafer on which the first contact pads 120 and the second contact pads 130 are disposed only on two sides, instead of having the first contact pads 120 and the second contact pads 130 disposed on edges of every matrix region. Thus, additional layout area needed on the wafer is further reduced; in other words, one single matrix region is defined on the wafer. Compared to the configuration in which one wafer is defined with a plurality of matrix regions thereon, the number of probes that need to be configured on a probe card is larger in a configuration in which only one single matrix region is defined. In terms of electrical connection of dies, two electrode points of each die within the matrix are directly connected to corresponding contact pads on the wafer through the corresponding layout lines (transmission lines), and the probe card can be divided into two blocks—one having the first probes 220 and the first switch group 2201, and the other having the second probes 230 and the second switch group 2301. The number of probes on the probe card corresponds to the numbers of columns and rows within the matrix region. When the wafer is planned with a plurality of matrix regions, it is determined, by moving the probe card (or by moving the wafer), to which columns the first probes 220 are to be electrically connected and to which rows the second probes 230 are to be electrically connected, and the die 110 to be currently inspected is defined by controlling the switches, so as to subsequently complete testing of every die on the wafer.

Figure 3:
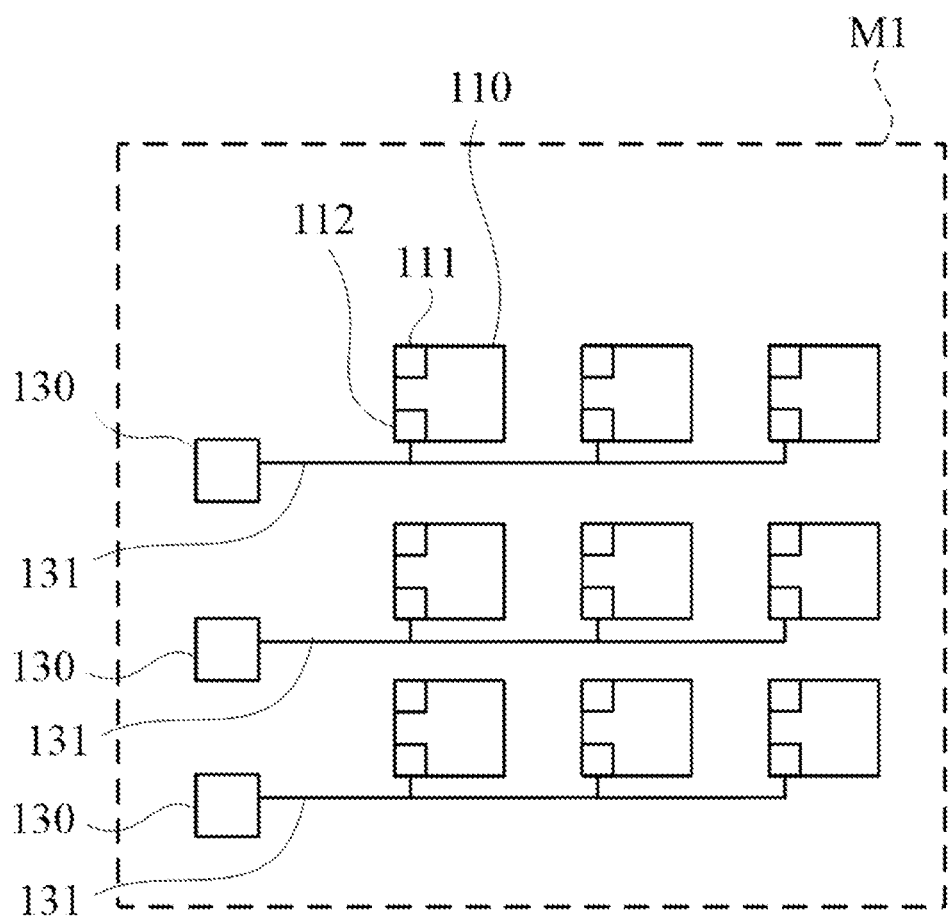
FIG. 3 is a circuit schematic diagram within a matrix region on a wafer according to another embodiment.
Figure 4:
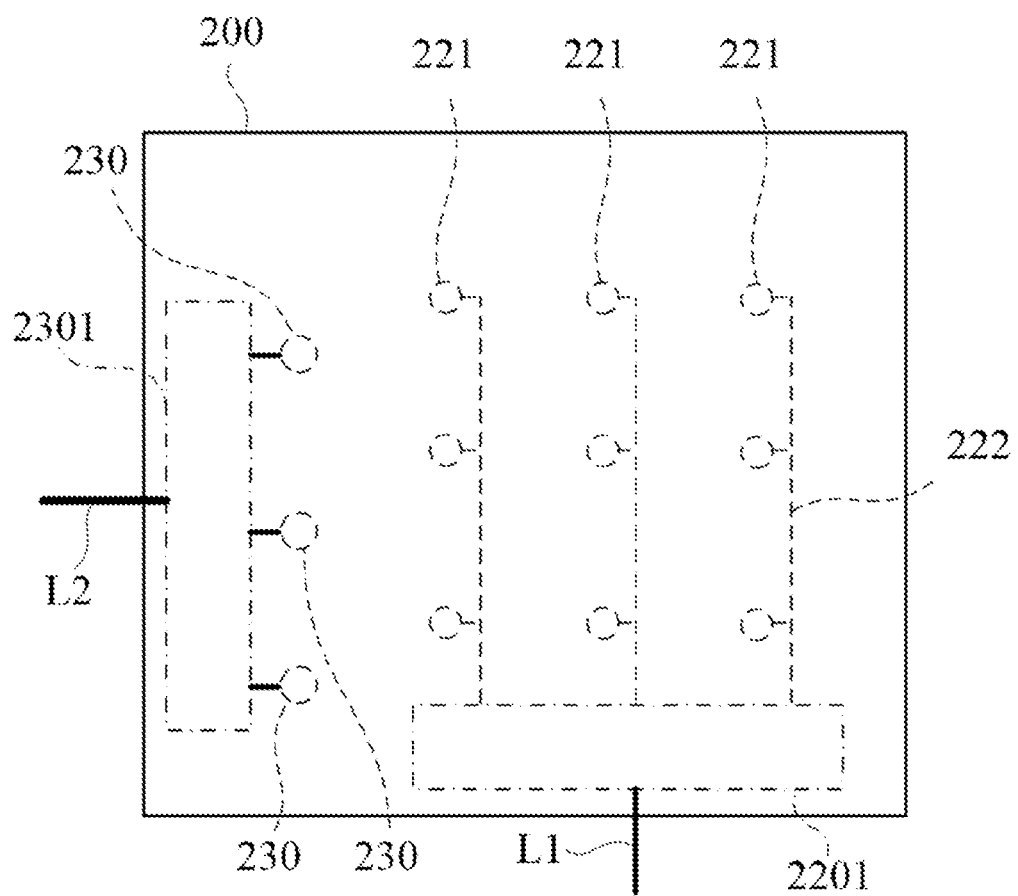
FIG. 4 is a schematic diagram of a probe card corresponding to the exemplary matrix region in FIG. 3 according to another embodiment.

Referring to both of FIG. 3 and FIG. 4, FIG. 3 shows a circuit schematic diagram of a matrix region on a wafer according to another embodiment, and FIG. 4 shows a schematic diagram of a probe card corresponding to the exemplary matrix region in FIG. 3 according to another embodiment. FIG. 3 and FIG. 4 are another implementation form with respect to that in FIG. 1 and FIG. 2. In FIG. 1, layout lines of columns and rows are all manufactured on the wafer; in FIG. 3, only layout lines of rows are manufactured on the wafer, and layout lines of columns are manufactured on the probe card 200. As shown in FIG. 4, the probe card 200 is configured with individual first probes 221 corresponding the column-sorted dies 110 within the matrix M1, and the first probes 221 are for contacting with the first electrode points 111 of the dies 110 within the matrix M1. The first probes 221 in the same column are connected in series by a column layout line 222, and one end of the column layout line 222 is coupled to the first switch group 2201. This embodiment eliminates the configuration of the first contact pads 120 on the wafer in FIG. 1, with however an increased number of the first probes 221 (with reference to the number of the first probes 220 in FIG. 2) on the probe card. Similarly, by controlling the switches, it is determined to which column the first probes 221 are to be coupled (for forming one of an input route and an output route of the test loop), and to which row the second probes 230 are to be coupled (for forming the other of the input route and the output route of the test loop), so as to complete testing corresponding to each die within the matrix M1 by controlling the switches. In the description above, an embodiment in which the columns and rows are swapped can also form the control pattern above. For example, column layout lines are manufactured on the wafer, and row layout lines are manufactured on the probe card 200, with associated details to be given with reference to FIG. 6 below.

Figure 5:
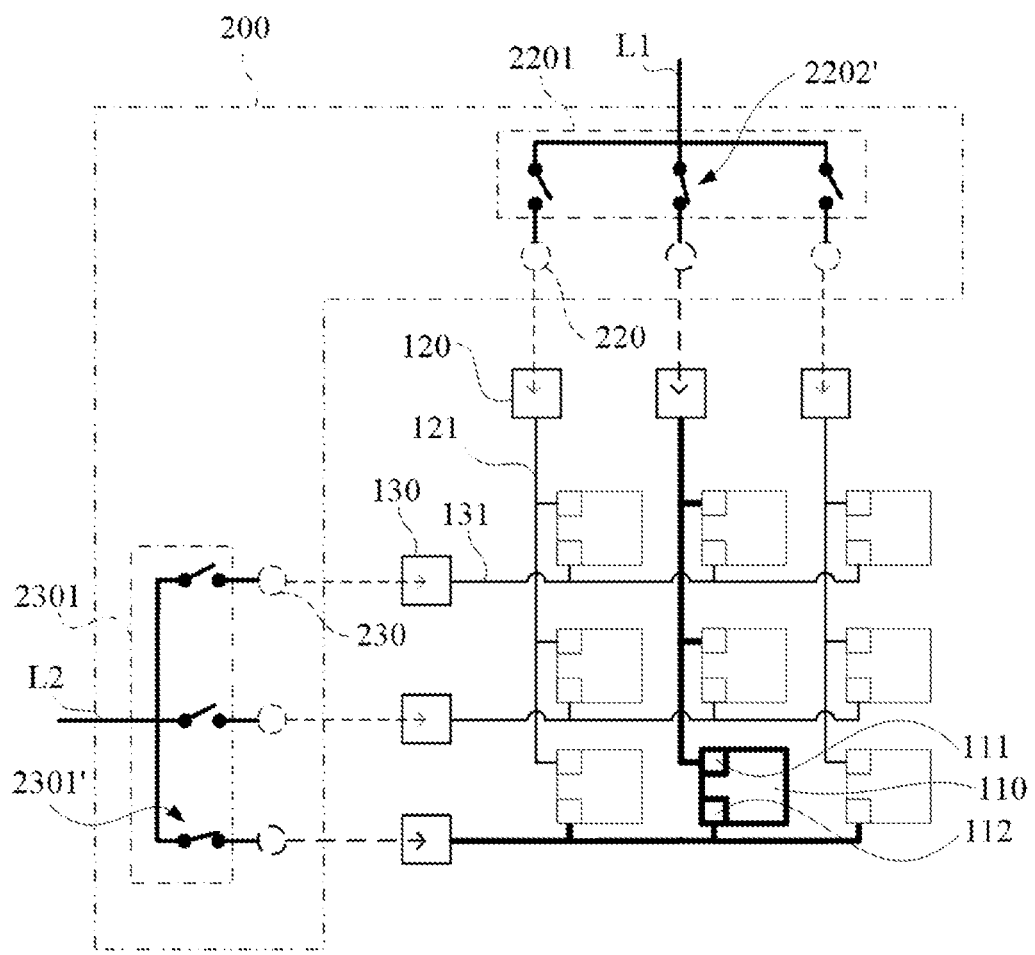
FIG. 5 is a schematic diagram of a test loop depicted according to the embodiments in FIG. 1 and FIG. 2.

FIG. 5 shows a schematic diagram of a test loop depicted according to the embodiments in FIG. 1 and FIG. 2. In the embodiments in FIG. 1 and FIG. 2, the plurality of first contact pads 120, the plurality of second contact pads 130, the plurality of first layout lines 121 serving as column layout lines and the plurality of second layout lines 131 serving as row layout lines are disposed within a matrix region (the matrix M1) on the wafer. The probe card 200 is configured with the first switch group 2201 (including a plurality of switches), the plurality of first probes 220, the second switch group 2301 (including a plurality of switches) and the plurality of second probes 230. For better illustrations, for the first probes 220 and the second probes 230 of the probe card 200 located above the wafer in the embodiment shown in FIG. 5, the correspondence between these probes and the contact pads during the test process is indicated by arrows.

FIG. 5 shows an example of control conditions of the first switch group 2201 and the second switch group 2301. Each switch in the first switch group 2201 and each switch in the second switch group 2301 can be independently controlled to be in a short-circuit (off) state or an open-circuit (on) state. Moreover, each switch is for coupling to an execution apparatus of a test item, and in FIG. 5, only the first switch group 2201 and the second switch group 2301 are depicted as an example for describing switching details in the test loop. A first switch 2201' controlled to be short-circuit enables the corresponding first layout line 121 to be selected (depicted by thick lines in the drawing). A second switch 2301' controlled to be short-circuit enables the corresponding second layout line 131 to be selected (depicted by thick lines in the drawing). Accordingly, the selected first layout line 121 and second layout line 131 enable one die 110 to be configured in the test loop, so as to perform the test process of this die 110. By controlling the short-circuit (off) state and the open-circuit (on) state of the switches in the first switch group 2201 and the second switch group 2301, the die 110 to be configured in the test loop can be quickly determined, thus eliminating a moving process in conventional testing and significantly reducing the total test time needed.

For example, in conventional testing, the test time needed for one die is approximately 50 ms, and the time needed for moving the probes to a next die is approximately 150 ms, resulting in a total test time of approximately 200 ms for one die. In terms of mini LEDs and micro LEDs that involve quantities of millions of dies, 55.5 hours in total are needed to complete testing for one million dies. In contrast, under the test configuration disclosed by the embodiments, for a matrix region set to be 100*100, the test time needed for one die is similarly approximately 50 ms, the time needed for moving the probe card (to the next matrix) is approximately 200 ms, and the total scanning (switching) time of the switch within one matrix is approximately 100 μs*100 μs=10 ms. Thus, the test time needed for one die among the 10,000 dies within the 100*100 matrix region is merely 50.02 ms, so that the total test time needed for the one million dies is only approximately 13.9 hours. Therefore, compared to the conventional test process that requires 55.5 hours, the test time needed is significantly reduced. The calculation equation for the example above is: (100*100*50+200+10)/10000, and this yields a result of merely approximately 50.02 ms for each inspection target.

Figure 6:
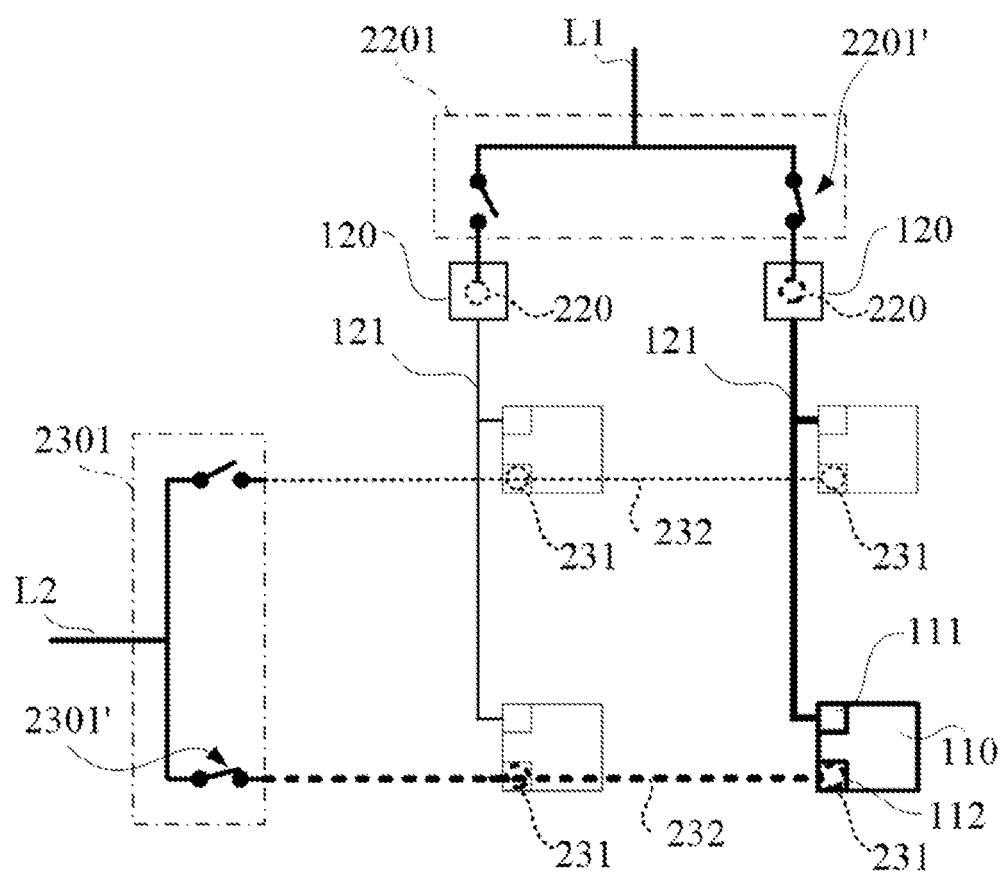
FIG. 6 is a schematic diagram of a test loop between a probe card and dies according to another embodiment.

Refer to FIG. 6 showing a schematic diagram of a test loop between a probe card and dies according to another embodiment. In the example in FIG. 6, column layout lines are manufactured on the wafer, and row layout lines are manufactured on the probe card. For further illustrations, in the example in FIG. 3, row layout lines are manufactured on the wafer; in the example in FIG. 4, column layout lines are manufactured on the probe card.

To better illustrate from the perspective of a top view, the dies 110 and the plurality of first layout lines 121 serving as column layout lines located on the wafer are drawn by solid lines, the switch groups, the switches, and the lines and elements (including the plurality of first probes 220, the plurality of second probes 231 and the plurality of row layout lines 232) drawn by dotted lines are all disposed on the probe card. The first switch group 2201 is coupled to the first probes 220, and the second switch group 2301 is coupled to the second probes 231. Each of the first contact pads 120 disposed on the wafer is coupled to the first electrode point 111 of each of the dies arranged in the same column by the corresponding first layout line 121. The second electrode point 112 of each of the dies is coupled to the row layout line 232 arranged in the same row and the second switch group 2301 by the corresponding second probe 231 disposed on the probe card. Thus, the first probes 220 are for contacting the first contact pads 120 on the wafer, and the second probes 231 are for contacting the corresponding electrode points on the dies 110. The number of the row layout lines 232 is equal to the number of the switches in the second switch group 230. For the exemplary matrix region in FIG. 6, the number of the row layout lines 232 is two.

The number of the second probes 231 needed is equal to the number of the corresponding electrode points (that is, electrode points not coupled to the layout lines) on all the dies 110 within the matrix (or referred to as a matrix region). For the exemplary matrix region shown in FIG. 6, the number of the second probes 231 is two. Moreover, the number of the first probes 220 needed is equal to the number of the first contact pads 120 within the matrix region (also equal to the number of the first layout lines 121), so that each of the first probes 220 is enabled to contact with the first contact pad 120 of the corresponding column by moving the probe card and/or moving the wafer to thereby establish a transmission line. For the exemplary matrix region shown in FIG. 6, the number of the first probes 220 is two.

Each switch in the first switch group 2201 and each switch in the second switch group 2301 can be independently controlled to be in short-circuit or open-circuit. As shown in FIG. 6, the first switch 2201' is controlled to be short-circuit, and enables the corresponding first layout line 121 to be selected (drawn in thick lines in the drawing) by the first probe 220 coupled to the first switch 2201' and the first contact pad 120 in contact with the first probe 220. On the other hand, the second switch 2301' is controlled to be short-circuit, and enables the corresponding row layout line 232 (or referred to as a second layout line) to be selected (depicted by thick lines in the drawing). Accordingly, the selected first layout line 121 and row layout line 232 enable one die 110 to be selected and configured in the test loop, so as to subsequently perform the test process of this die 110. By controlling the short-circuit (off) state and the open-circuit (on) state of the switches in the first switch group 2201 and the second switch group 2301, the die 110 to be configured in the test loop can be quickly determined.

Figure 7:
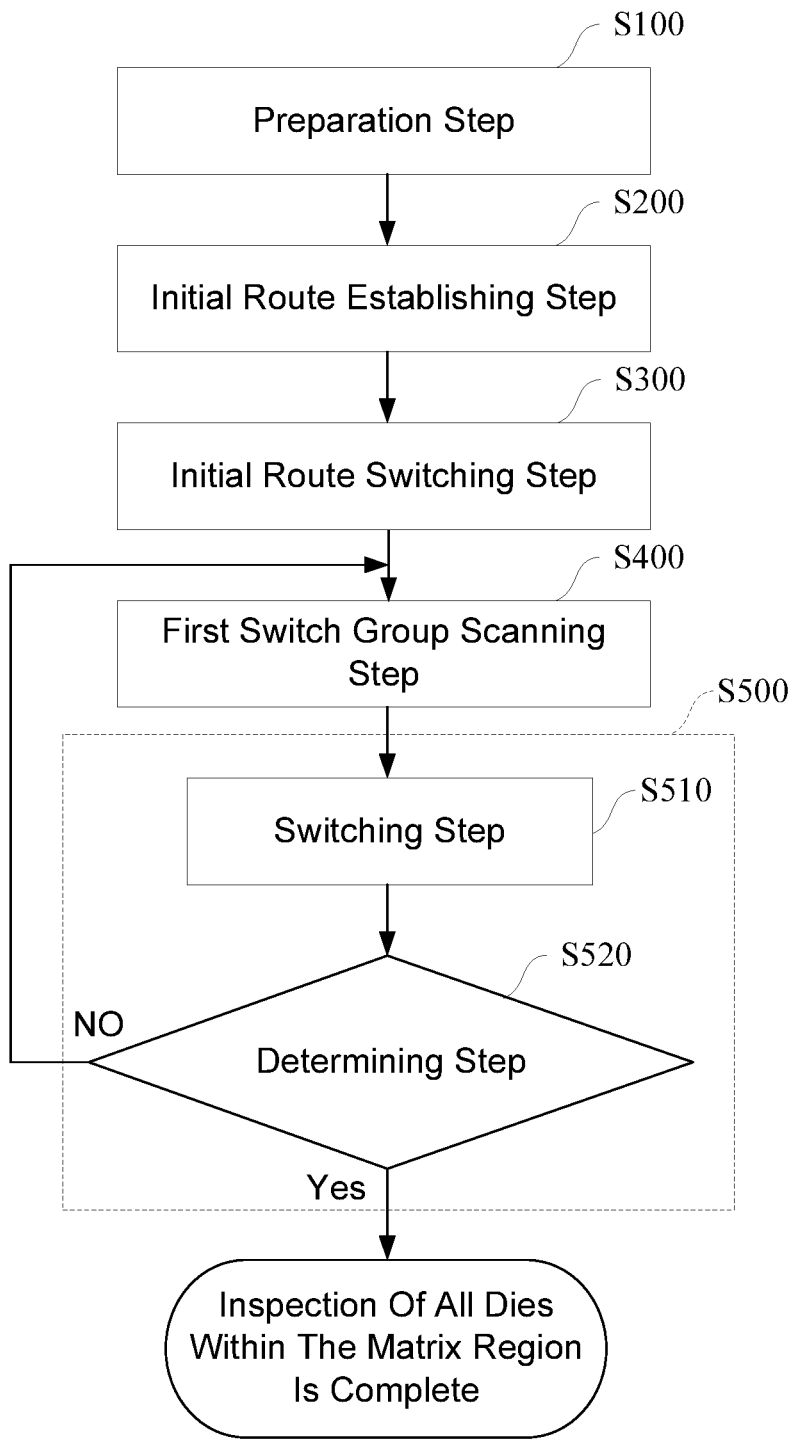
FIG. 7 is a flowchart of a wafer inspection method according to an embodiment.
Figure 8:
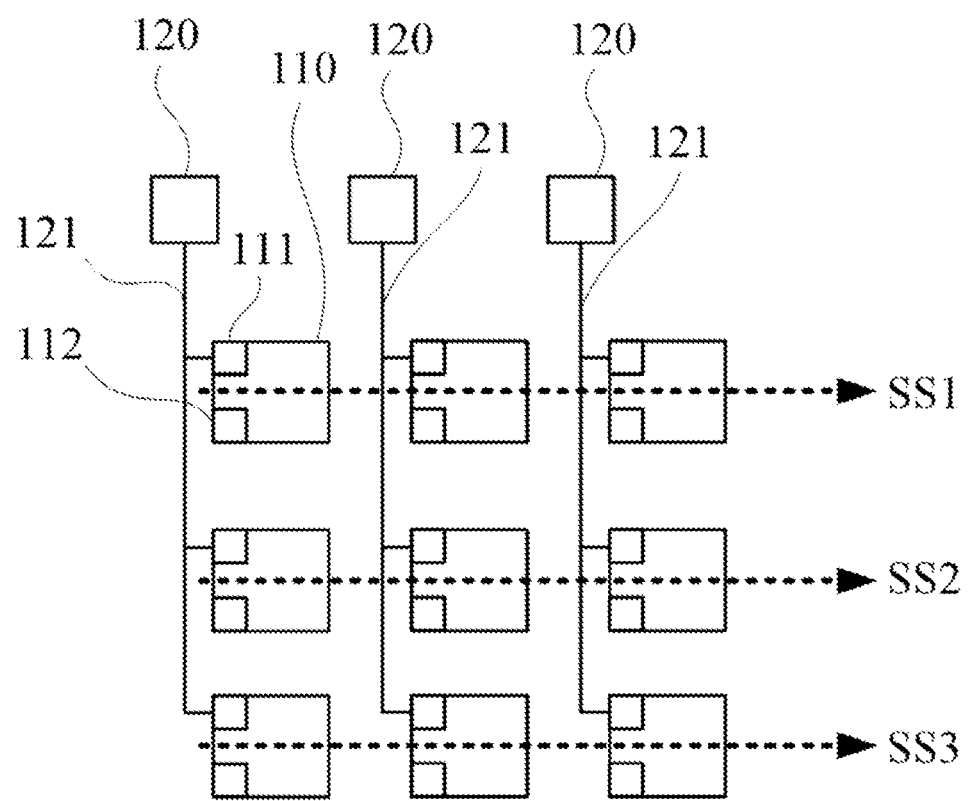
FIG. 8 is a schematic diagram of dies and a configuration of part of layout lines on a wafer according to an embodiment.

Referring to FIG. 7 and FIG. 8, FIG. 7 shows a flowchart of a wafer inspection method according to an embodiment, and FIG. 8 shows a schematic diagram of dies and a configuration of part of layout lines on a wafer according to an embodiment. FIG. 7 shows an integrated illustration of methods and processes based on the configurations described in the foregoing embodiments. The method described herein enables a plurality of dies within a matrix region on a wafer to be configured one after another in turn in a test loop needed for inspection. The wafer includes a plurality of first layout lines and a plurality of first contact pads correspondingly coupled to the first layout lines, respectively. Under the first classification definition, the first electrode points of each of the dies are coupled to the corresponding one of the first layout lines. The dies under the second classification definition appear as series arranged in parallel. The first classification definition refers to one of an arrangement in the same column or an arrangement in the same row, and the second classification definition refers to the other of the arrangement in the same column or the arrangement in the same row.

Taking FIG. 8 for example, the first classification definition is defined as an arrangement in the same column, and so the second classification definition is defined as an arrangement in the same row. In the arrangement direction of the same column, the first electrode points 111 of the dies 110 of each column are coupled to the corresponding one of the first layout lines 121. In the arrangement direction of the same row, the dies 110 of each row appear as series arranged in parallel, the dies in the same row form one series, and thus a total of three series, that is, SS1 to SS3, are shown in FIG. 8. The dies in the same row may achieve coupling between the second electrode points 112 of the dies 110 in each row by additional layout lines on the wafer (as the embodiment shown in FIG. 1), or achieve coupling between the second electrode points 112 of the die 110 in each row by layout lines and the second probes on the probe card (as the embodiment shown in FIG. 4).

As shown in FIG. 7, the wafer inspection method includes a preparation step S100, an initial route establishing step S200, an initial route switching step S300, a first switch group scanning step S400, and a second switch group scanning step S500.

In the preparation step S100, a probe card is provided, for example, the probe card 200 in the foregoing embodiments.

In the initial route establishing step S200, each of the first probes on the probe card is enabled to contact corresponding one of the first contact pads, and each of the second probes is enabled to couple to a second electrode point of corresponding one of the dies. In the initial route establishing step S200, an operation for the probe to contact a target may be achieved by one of the three means below: driving a carrier carrying the wafer, driving the probe card, and simultaneously driving the carrier and the probe card.

In the initial route switching step S300, a first die under inspection is configured to be in the test loop.

In the first switch group scanning step S400, a die arranged in the matrix is selected by controlling the first switch group. For example, each of the dies corresponding to one column is selected (for example, three dies corresponding to the first column in FIG. 5 are selected).

The second switch group scanning step S500 includes switching step S510 and determining step S520. In the switching step S510, sequential selection in a scanning manner is performed on the dies arranged in the matrix by controlling the second switch group, an inspection procedure is performed on the selected die after each round of selection, and a next die is selected once the test process ends, so as to form switching in a scanning manner. In the determining step S520, it is determined whether the first switch group has completed all the switching, that is, it is determined whether each switch in the first switch group for coupling to the dies has been short-circuited one after another in turn. In the determining step S520, if the determination result is negative, the first switch group scanning step S400 is repeated to control the next switch; if the determination result is affirmative, inspection of the individual dies within the matrix region is complete. For example, in the second switch group scanning step S500, each of the dies corresponding to each row is selected one after another in turn (for example, the three dies corresponding to the first row in FIG. 5 are selected), and one die that intersects with the selected column in step S400 is in fact the die that is configured in the test loop. Accordingly, once the first column is selected by the first switch group, control in a scanning manner is performed by the second switch group, hence enabling the three dies corresponding to the first column to be configured one after another in turn in the test loop used for performing the test process. Only when testing of one die is complete, the second switch group then performs switching. The determining step S520 is performed once all of the dies of the selected column have been inspected, and step S400 is repeated to enable the first switch group to select the next column when the first switch group has not yet completed all the switching, or the inspection of all of the dies within the matrix region is complete once the first switch group completes all the switching.

Further, when the setting of the matrix region does not cover all the dies on the wafer, a matrix region switching step (not shown) needs to be performed once the inspection of all the dies within one matrix region is complete. Step S200 to step S520 are repeated for the uninspected matrix region, so as to cover dies within another region on the wafer, until the inspection of all of the dies on the wafer is complete.

In the column/row control means in a matrix pattern, an exposure time of a camera device additionally used in coordination may be controlled; that is, the exposure time is equivalent to the time needed for scanning all of the dies within one matrix region. An image captured by the camera device may be presented as a light spot arrangement in a matrix. Moreover, based on the matrix scanning (with coordinate position information), the corresponding die may be matched for each light spot, so that the light emitting intensity and other parameters related to a light emitting state of each die can be acquired, hence eliminating the use of an integrating sphere.

Light emitting surfaces of dies having a light emitting characteristic may be arranged on the same side as or opposite side to the P-electrodes or the N-electrodes. In an embodiment in which the dies above are arranged on the same side, taking FIG. 2 for example, a middle portion of the probe card 200 may be provided with a through hole for the camera device to capture images.

The present disclosure is illustrated by various aspects and embodiments. However, persons skilled in the art understand that the various aspects and embodiments are illustrative rather than restrictive of the scope of the present disclosure. After perusing this specification, persons skilled in the art may come up with other aspects and embodiments without departing from the scope of the present disclosure. All equivalent variations and replacements of the aspects and the embodiments must fall within the scope of the present disclosure. Therefore, the scope of the protection of rights of the present disclosure shall be defined by the appended claims.

What is claimed is:

1. A wafer inspection apparatus for inspecting a plurality of dies via within a matrix region on a wafer; the wafer laid out with a plurality of first layout lines, a plurality of second layout lines, a plurality of first contact pads correspondingly coupled to the plurality of first layout lines, respectively, and a plurality of second contact pads correspondingly coupled to the plurality of second layout lines, respectively; each of the first layout lines coupling to a first electrode point of each of the dies arranged in a same column, and each of the second layout lines coupling to a second electrode point of each of the dies arranged in a same row; the wafer inspection apparatus comprising:

a probe card is configured for providing a selected one of the dies via a first route and a second route, so that the first route, the second route and the selected die forming a test loop in an inspection procedure, the probe card including a plurality of first probes, a plurality of second probes, a first switch group coupled to the first probes, and a second switch group coupled to the second probes;

wherein, each of the first probes is provided for contacting corresponding one of the first contact pads in the inspection procedure, and each of the second probes is provided for contacting corresponding one of the second contact pads in the inspection procedure;

wherein, the first switch group is controlled to couple one of the first probes to the first route, and the second switch group is controlled to couple one of the second probes to the second route, and the first switch group and the second switch group enable the selected die to be configured in the test loop.

2. The wafer inspection apparatus according to claim 1, wherein the first switch group comprises a plurality of first switches correspondingly coupled to the first probes, respectively, and the second switch group comprises a plurality of second switches correspondingly coupled to the second probes, respectively; one end of each of the first switches is coupled to the first route, and the other end of each of the first switches is selectively coupled to the corresponding first probe based on whether the first switch is controlled as turned on or turned off; one end of each of the second switches is coupled to the second route, and the other end of each of the second switches is selectively coupled to the corresponding second probe based on whether the second switch is controlled as turned on or turned off.

3. The wafer inspection apparatus according to claim 2, wherein each of the first switches and the second switches is a relay.

4. The wafer inspection apparatus according to claim 1, the number of the first probes is equal to the number of the first layout lines, and the number of the second probes is equal to the number of the second layout lines.

5. The wafer inspection apparatus according to claim 1, wherein the first contact pads and the second contact pads are disposed on edges of the matrix region, and the matrix region is configured to cover all of the dies on the wafer or to cover part of the dies on the wafer.

6. The wafer inspection apparatus according to claim 1, further comprising a camera device for capturing an image of the matrix region, wherein the camera device provides an exposure time to capture an image of a light-emitting state exhibited by the dies within the matrix region configured one after another in turn in the test loop during the inspection procedure.

7. The wafer inspection apparatus according to claim 6, wherein the exposure time is equal to a time needed for the dies within the matrix region to be configured one after another in turn in the test loop during the inspection procedure.

8. A wafer inspection apparatus for inspecting a plurality of dies within a matrix region on a wafer; the wafer laid out with a plurality of first layout lines and a plurality of first contact pads correspondingly coupled to the first layout lines, respectively, each of the first layout lines coupling to a first electrode point of each of the dies arranged under a first classification definition that is one of an arrangement in a same column and an arrangement in a same row; the wafer inspection apparatus comprising:
  a probe card is configured for providing a selected one of the dies via a first route and a second route, so that the first route, the second route and the selected die forming a test loop in an inspection procedure, the probe card including a plurality of first probes, a plurality of second probes, a first switch group coupled to the first probes, a second switch group and a plurality of second layout lines coupled to the second switch group, each of the second layout lines correspondingly coupling to each of the second probes under a second classification definition that is the other of the arrangement in a same column and the arrangement in a same row;
  wherein, each of the first probes is provided for contacting corresponding one of the first contact pads in the inspection procedure, and each of the second probes is provided for contacting a second electrode point of corresponding one of the dies in the inspection procedure;
  wherein, the first switch group is controlled to couple one of the first probes to the first route, and the second switch group is controlled to couple one of the second layout lines to the second route, wherein the first switch group and the second switch group enable the die configured within the test loop to be selected.

9. The wafer inspection apparatus according to claim 8, wherein the first switch group comprises a plurality of first switches correspondingly coupled to the first probes, respectively, and the second switch group comprises a plurality of second switches correspondingly coupled to the second layout lines, respectively; one end of each of the first switches is coupled to the first route, and the other end of each of the first switches is selectively coupled to the corresponding first probe based on whether the first switch is controlled as turned on or turned off; one end of each of the second switches is coupled to the second route, and the other end of each of the second switches is selectively coupled to the corresponding second layout line based on whether the second switch is controlled as turned on or turned off.

10. The wafer inspection apparatus according to claim 9, wherein each of the first switches and the second switches is a relay.

11. The wafer inspection apparatus according to claim 8, the number of the first probes is equal to the number of the first layout lines, and the number of the second probes is equal to the number of the dies within the matrix region.

12. The wafer inspection apparatus according to claim 8, wherein the first contact pads are disposed on edges of the matrix region, and the matrix region is configured to cover all of the dies on the wafer or to cover part of the dies on the wafer.

13. The wafer inspection apparatus according to claim 8, further comprising a camera device for capturing an image of the matrix region, wherein the camera device provides an exposure time to capture an image of a light-emitting state exhibited by the dies within the matrix region configured one after another in turn in the test loop during the inspection procedure.

14. The wafer inspection apparatus according to claim 13, wherein the exposure time is equal to a time needed for the dies within the matrix region to be configured one after another in turn in the test loop during the inspection procedure.

15. A wafer inspection method for configuring a plurality of dies within a matrix region on a wafer one after another in turn in a test loop needed for inspection, the wafer comprising a plurality of first layout lines and a plurality of first contact pads correspondingly coupled to the first layout lines, respectively; under a first classification definition, a first electrode point of each of the dies coupled to corresponding one of the first layout lines, and under a second classification definition, the dies presented as a plurality of series arranged in parallel; the wafer inspection method comprising:
  a preparation step of providing a probe card, wherein the probe card comprises a plurality of first probes, a plurality of second probes, a first switch group coupled between the first probes and a first route, and a second switch group coupled between the second probes and a second route;
  an initial route establishing step of contacting each of the first probes with corresponding one of the first contact pads, and coupling each of the second probes to a second electrode point of each of the dies;
  an initial route switching step of selectively coupling one of the first layout lines to the first route by controlling the first switch group, selectively coupling one of the plurality of series of dies to the second route by controlling the second switch group, and configuring the die coupled to both of the first route and the second route to be configured in the test loop, wherein the first classification definition is one of an arrangement in a same column and arrangement in a same row, and the second classification definition is the other of the arrangement in a same column and the arrangement in a same row;
  a first switch group scanning step of switching the first layout lines one after another in turn to couple to the first route by controlling the first switch group, for the corresponding dies to be configured one after another in turn in the test loop for performing inspection, and performing a next step once all of the first layout lines have been coupled to the first route; and a second switch group scanning step of switching the dies corresponding to a next one of the series to couple to the second route by controlling the second switch group, and repeating the first switch group scanning step, until the inspection of the dies within the matrix region is complete once all of the dies corresponding to each series have been coupled to the second route.

16. The wafer inspection method according to claim 15, wherein the wafer comprises a plurality of second layout lines and a plurality of second contact pads correspondingly coupled to the second layout lines, respectively, the second electrode point of each of the dies corresponding to each series is coupled to same one of the second layout lines, wherein in the initial route establishing step, each of the second probes is coupled to the second electrode point of corresponding one of the dies by contacting each of the second probes with corresponding one of the second contact pads.

17. The wafer inspection method according to claim 15, wherein the first switch group is coupled between the first probes and the first route, the probe card comprises a plurality of second layout lines coupled to the second switch group, the second switch group is coupled between the second layout lines and the second route, and in the initial route establishing step, the second probes coupled to one of the second layout lines are for one by one contacting the second electrode points of the dies arranged within the same series.

18. The wafer inspection method according to claim 15, wherein the second switch group scanning step further comprises a matrix region switching step of moving the matrix region to cover other regions not yet inspected on the wafer, and repeating the initial route establishing step, the initial route switching step, the first switch group scanning step and the second switch group scanning step, for the dies within the uninspected matrix region to be configured one after another in turn in the test loop needed for inspection, until all the dies on the wafer are completely inspected.

19. The wafer inspection method according to claim 15, wherein in the inspection procedure of one matrix region, within a period from a start of the first switch group scanning step to an end of the second switch group scanning step, long-term imaging of the matrix region is performed simultaneously to acquire image data recorded with light emitting levels of the individual dies within the matrix region.

* * * * *